United States Patent
Alpert et al.

(10) Patent No.: US 7,127,696 B2
(45) Date of Patent: Oct. 24, 2006

(54) METHOD AND APPARATUS FOR GENERATING STEINER TREES USING SIMULTANEOUS BLOCKAGE AVOIDANCE, DELAY OPTIMIZATION AND DESIGN DENSITY MANAGEMENT

(75) Inventors: Charles Jay Alpert, Round Rock, TX (US); Rama Gopal Gandham, Poughkeepsie, NY (US); Milos Hrkic, Princeton, NJ (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 10/738,711

(22) Filed: Dec. 17, 2003

(65) Prior Publication Data

US 2005/0138578 A1 Jun. 23, 2005

(51) Int. Cl.
*G06F 17/50* (2006.01)
(52) U.S. Cl. .............................. 716/10; 716/2; 716/13
(58) Field of Classification Search ................. 716/10, 716/13, 2
See application file for complete search history.

(56) References Cited

OTHER PUBLICATIONS

Hu et al., "Buffer Insertion with Adaptive Blockage Avoidance", ISPD, Apr. 2002, pp. 92-97.*
Apert et al., "Steiner Tree Optimization for Buffers, Blockages, and Bays", IEEE transaction, Apr. 2001, pp. 556-562.*
Hrkic et al., "Buffer Tree Synthesis With consideration of Temporal Locality, Sink Polarity Requirements, Solution Cost, Congestion, and Blockages", IEEE Transaction vol. 22, Issue 4, Apr. 2003, pp. 481-491.*
Alpert et al., "Porosity Aware Buffered Steiner Tree Construction", ISPD, Apr. 2003, pp. 158-165.
Alpert et al., "Buffered Steiner Trees for Difficult Instances", IEEE Transactions on Computer-Aided Design of Integrated Circuits and Systems, vol. 21, No. 1, Jan. 2002, pp. 3-14.
Alpert et al., "A Practical Methodology for Early Buffer and Wire Resource Allocation", IEEE/ACM DAC, 2001, pp. 189-195.
Cong, "Challenges and Opportunities for Design Innovations in Nanometer Technologies", SRC Working Papers, 1997, pp. 1-15.
Cong et al., "Routing Tree Construction Under Fixed Buffer Locations", IEEE/ACM DAC 2000, pp. 379-384.

(Continued)

*Primary Examiner*—Jack Chiang
*Assistant Examiner*—Tuyen To
(74) *Attorney, Agent, or Firm*—Duke W. Yee; Casimer K. Salys; Theodore D. Fay, III

(57) ABSTRACT

A mechanism for constructing Steiner trees using simultaneous blockage avoidance, delay optimization, and design density management are provided. An initial tiled timing-driven Steiner tree is obtained for an integrated circuit design. The Steiner tree is broken into 2-paths for which plates are generated designated the permissible area in which a Steiner point may migrate. Each 2-path is optimized by calculating a cost for each tile in the plate as a function of an environmental cost, a tile delay cost, and a trade-off value. A minimum cost tile is then selected as the point to which the Steiner point in the 2-path, if any, is to migrate. Once each 2-path is processed in this manner, routing is performed so as to minimize the cost at the source. This process may be iteratively repeated with new trade-off values until all of the nets have zero or positive slew.

25 Claims, 8 Drawing Sheets

OTHER PUBLICATIONS

Hrkic et al., "S-Tree: A Technique for Buffered Routing Tree Synthesis", IEEE/ACM DAC 2002, pp. 578-583.

Jagannathan et al., "A Fast Algorithm for Context-Aware Buffer Insertion", DAC 2000, pp. 368-373.

Lai et al., "Maze Routing with Buffer Insertion and Wiresizing", IEEE/ACM DAC 2000, pp. 374-378.

Lee, "An Algorithm for Path Connections and Its Applications", IRE Trans. on Electronic Computers, 1961, pp. 346-365.

Lillis et al., "New Performance Driven Routing Techniques with Explicit Area/Delay Tradeoff and Simultaneous Wire Sizing", 33th IEEE/ACM DAC 1996, pp. 395-400.

Lillis et al., "Optimal Wire Sizing and Buffer Insertion for Low Power and a Generalized Delay Model", IEEE Journal of Solid-State Circuits, vol. 31, No. 3, Mar. 1996, pp. 437-447.

Otten, "Global Wires Harmful?", ACM/IEEE ISPD, pp. 104-109, 1998.

Saxena et al., "The Scaling Challenge: Can Correct-by-Construction Design Help?", Proc. ISPD, 2003, pp. 51-58.

Tang et al., "A New Algorithm for Routing Tree Construction with Buffer Insertion and Wire Sizing under Obstacle Constraints", IEEE/ACM ICCAD, 2001, pp. 49-56.

van Ginneken, "Buffer Placement in Distributed RC-tree Networks for Minimal Elmore Delay", Intl. Symposium on Circuits and Systems, 1990, pp. 865-868.

Zhou et al., "Simultaneous Routing and Buffer Insertion with Restrictions on Buffer Locations", IEEE/ACM DAC, 1999, pp. 96-99.

U.S. Appl. No. 10/418,469, Alpert et al., Porosity Aware Buffered Steiner Tree Construction, Apr. 17, 2003.

U.S. Appl. No. 10/738,714, Alpert et al., Method and Apparatus for Performing Density-Biased Buffer Insertion in an Integrated Circuit Design, Dec. 17, 2003.

* cited by examiner

FIG. 9

| TILING SIZE | CASE | NUMBER OF BUFFERS | SLACK IMPROVEMENT | CPU USAGE (SECONDS) | | |
|---|---|---|---|---|---|---|
| | | | | STEINER | BEN | VG |
| 83 x 82 TILES | BASE | 5917 | 5070 ps | 367 | 0 | 258 |
| | ELEC | 7160 | 5022 ps | 367 | 32 | 677 |
| | CRIT | 7109 | 5116 ps | 367 | 29 | 621 |
| 166 x 164 TILES | BASE | 5962 | 5050 ps | 367 | 0 | 250 |
| | ELEC | 7153 | 5068 ps | 367 | 139 | 693 |
| | CRIT | 7070 | 5134 ps | 367 | 126 | 648 |
| 249 x 247 TILES | BASE | 5926 | 5045 ps | 367 | 0 | 264 |
| | ELEC | 7186 | 5081 ps | 367 | 425 | 697 |
| | CRIT | 7078 | 5134 ps | 367 | 352 | 655 |
| 332 x 329 TILES | BASE | 5978 | 5034 ps | 367 | 0 | 254 |
| | ELEC | 7230 | 5078 ps | 367 | 759 | 695 |
| | CRIT | 7066 | 5132 ps | 367 | 660 | 653 |

FIG. 10

| 100 e(t) | BASE | ELEC | CRIT | 100 e(t) | BASE | ELEC | CRIT |
|---|---|---|---|---|---|---|---|
| 0-4.99 | 0 | 0 | 0 | 50-54.99 | 368 | 487 | 524 |
| 5-9.99 | 158 | 378 | 282 | 55-59.99 | 398 | 394 | 374 |
| 10-14.99 | 252 | 729 | 625 | 60-64.99 | 360 | 375 | 337 |
| 15-19.99 | 236 | 730 | 714 | 65-69.99 | 298 | 312 | 280 |
| 20-24.99 | 220 | 523 | 566 | 70-74.99 | 437 | 270 | 274 |
| 25-29.99 | 196 | 435 | 449 | 75-79.99 | 544 | 270 | 252 |
| 30-34.99 | 196 | 408 | 427 | 80-84.99 | 418 | 206 | 187 |
| 35-39.99 | 241 | 372 | 364 | 85-89.99 | 369 | 168 | 176 |
| 40-44.99 | 256 | 449 | 436 | 90-94.99 | 396 | 142 | 151 |
| 45-49.99 | 264 | 513 | 516 | 95-99.99 | 318 | 25 | 144 |

METHOD AND APPARATUS FOR GENERATING STEINER TREES USING SIMULTANEOUS BLOCKAGE AVOIDANCE, DELAY OPTIMIZATION AND DESIGN DENSITY MANAGEMENT

RELATED APPLICATION

The present invention is related to commonly assigned and co-pending U.S. patent application Ser. No. 10/418,469 entitled "Porosity Aware Buffered Steiner Tree Construction," filed on Apr. 17, 2003, which is hereby incorporated by reference.

BACKGROUND OF THE INVENTION

1. Technical Field

The present invention is directed to an improved method and apparatus for performing buffer insertion into an integrated circuit design. More specifically, the present invention is directed to a routing and buffer insertion technique that simultaneously performs blockage avoidance, delay optimization, and design density management.

2. Description of Related Art

It is now widely accepted that interconnect performance is becoming increasingly dominant over transistor and logic performance in the deep submicron regime. Buffer insertion is now a fundamental technology used in modern integrated circuit design methodologies. As gate delays decrease with increasing chip dimensions, however, the number of buffers required quickly rises. It is expected that close to 800,000 buffers will be required for 50 nanometer technologies. Thus, it is critical to automate the entire interconnect optimization process to efficiently achieve timing closure.

In addition to timing issues, managing the density of an integrated circuit design is becoming more problematic. The performance of a design highly depends on how packed the logic is geographically in the physical integrated circuit. If the logic is completely spread out, the design is routable but the performance suffers significantly. On the other hand, if the logic is packed, the design is not routable but would yield the best timing characteristics. A packed design is unsuitable for later design changes, such as the insertion of additional logic, such as a synthesized clock tree, since there is no room for the new logic.

Physical synthesis is now prominent in the automated design of blocks for use in high performance processors and Application Specific Integrated Circuits (ASICs). Physical synthesis is the process of concurrently optimizing placement, timing, power consumption, crosstalk effects, and the like, in an integrated circuit design. Physical synthesis helps to eliminate iterations between synthesis and place-and-route. Physical synthesis has the ability to repower gates, insert buffers, clone gates, and the like. Hence, the area of logic in the design remains fluid.

During physical synthesis, buffer insertion is called for to either optimize nets for delay or to fix nets due to electrical violations. One mechanism for performing buffer insertion on a fixed Steiner integrated circuit topology is the van Ginneken algorithm. Van Ginneken's dynamic programming algorithm, described in "Buffer Placement in Distributed RC-tree Networks for Minimal Elmore Delay," Int'l Symposium on Circuits and Systems, 1990, pp. 865–868, which is hereby incorporated by reference, has become a classic in the field. Given a fixed Steiner tree topology, the van Ginneken algorithm finds the optimal buffer placement on the topology under an Elmore delay model for a single buffer type and simple gate delay model. The primary idea of van Ginneken is to choose a set of buffer candidate locations that lie on the Steiner topology at some uniformly fixed distance apart. Buffer insertion then proceeds for that particular set of candidates from sink to source.

One problem with the van Ginneken approach to buffer insertion is that buffers are inserted at uniformly placed points along a net. That is, there is no consideration for the density of the logic in the vicinity of the candidate point. Thus, buffers may be inserted into regions that are very densely packed with logic or into regions that are sparsely populated with logic, depending on the particular uniform spacing of the candidate points.

In addition, the major weakness of the van Ginneken approach is that it requires a fixed Steiner tree topology that has to be provided in advance. This makes the final buffer solution quality dependent on the input Steiner tree. Even though a particular van Ginneken solution may be optimal for a given topology, the van Ginneken algorithm will yield poor solutions when fed a poor topology. That is, the van Ginneken approach does not take into consideration the physical layout of the environment.

Recent trends toward hierarchical or semi-hierarchical chip design and system-on-chip design force certain regions of a chip to be occupied by large building blocks so that buffer insertion is not permitted in these regions. These constraints on buffer locations can severely hamper solution quality, and these effects need to be considered when optimizing an integrated circuit design.

Finally, the van Ginneken algorithm does not differentiate between critical and non-critical nets. To the contrary, the van Ginneken algorithm treats all nets as having the same criticality and provides a uniform distribution of buffer insertion locations regardless of the actual criticality of the nets. However, in some cases, critical nets should be considered differently from non-critical nets when performing routing and buffer insertion in order to make sure that the delay in the nets is optimized.

Thus, it would be beneficial to have a method and apparatus for generating Steiner trees for routing of nets in an integrated circuit design and performing buffer insertion that takes into account blockage avoidance, delay optimization and design density management.

SUMMARY OF THE INVENTION

The present invention provides a method, apparatus, and computer program product for constructing Steiner trees using simultaneous blockage avoidance, delay optimization, and design density management. With the mechanism of the present invention, an initial timing-driven Steiner tree is obtained for an integrated circuit design. The Steiner tree is divided into tiles and an environmental cost is associated with each tile. The Steiner tree is broken into 2-paths and plates are generated for each of the 2-paths designated the permissible area in which a Steiner point may migrate.

Each 2-path is optimized by calculating a total cost for each tile in the plate. The total cost is a function of the environmental cost associated with the tile, a tile delay cost associated with the tile, and a trade-off value that represents a trade-off between the environmental component (which is most important to non-critical nets) and the timing component (which is most important to critical nets) of the cost function. A minimum cost tile is then selected as the point to which the Steiner point in the 2-path, if any, is to migrate.

Once each 2-path is processed in this manner, routing is performed so as to minimize the cost at the source. A timing analysis may then be performed to determine if there are any nets in the integrated circuit design that have negative slew. If there are, those nets with negative slew are selected and the process is repeated on those nets with a new trade-off value. This process may be iteratively repeated until all of the nets have zero or positive slew. The resulting adjusted Steiner tree may then undergo buffer insertion.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 9 is an exemplary diagram illustrating the total number of buffers, average slack improvement, and total CPU time for generating the timing driven Steiner tree (Steiner), performing re-routing based on environmental costs (BEN), and performing van Ginneken-based buffer insertion (VG);

FIG. 10 is an exemplary diagram illustrating how well the present invention utilized resources for a tiling with 249 rows.

DETAILED DESCRIPTION OF THE PREFERRED EMBODIMENT

Figure 1:
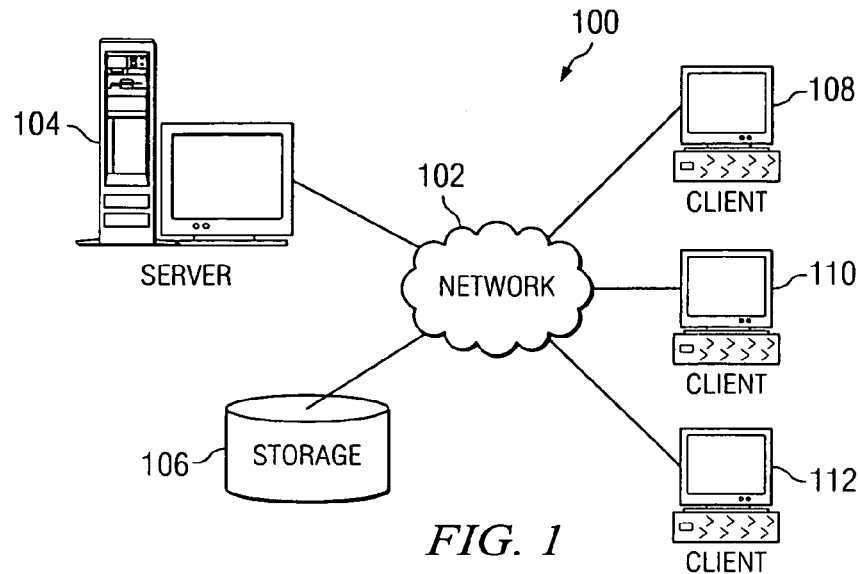
FIG. 1 is an exemplary pictorial representation which depicts a network of data processing systems in accordance with the present invention.
Figure 2:
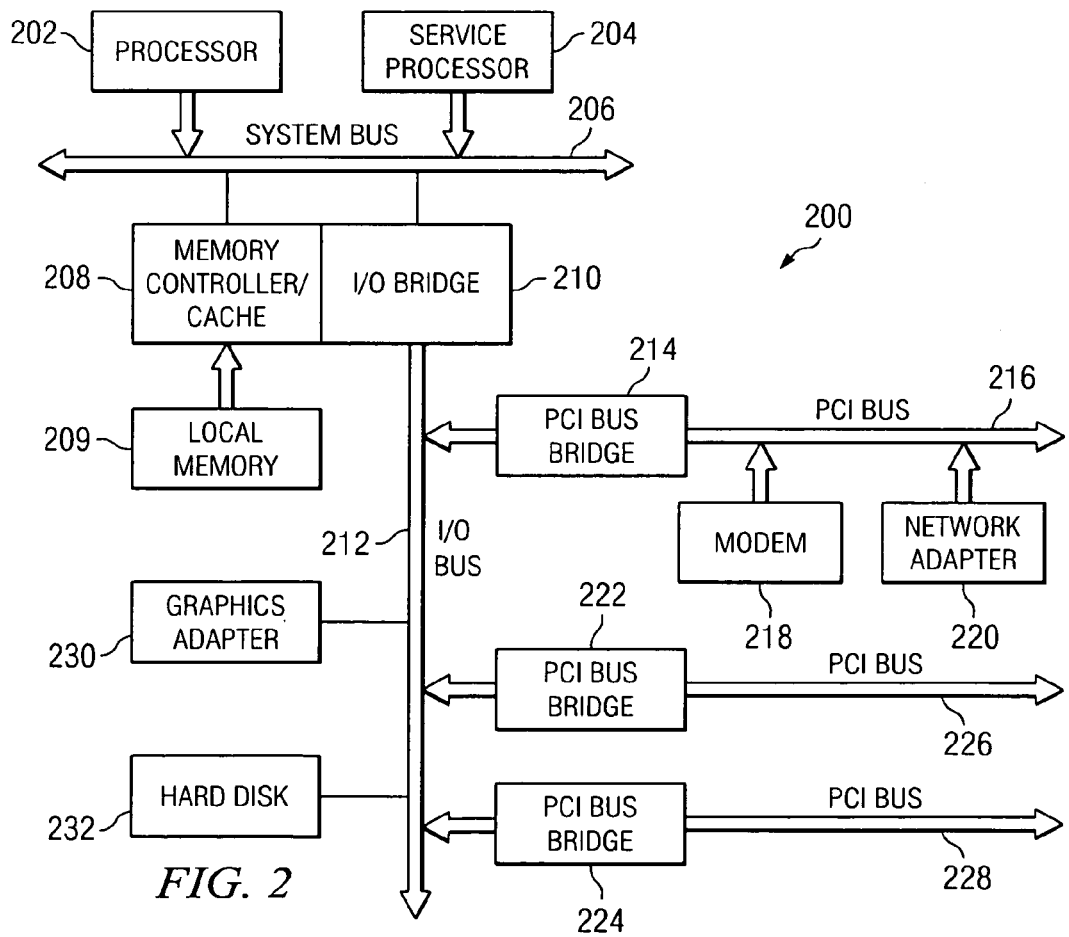
FIG. 2 is a more detailed exemplary illustration of a computer system that may be used to implement a stand-alone computing system or any of the computer systems of FIG. 1 in accordance with the present invention.

The present invention provides a method, apparatus and computer program product for generating Steiner tree routings and buffer insertion that simultaneously performs blockage avoidance, delay optimization, and design density management. The data processing device may be a stand-alone computing device or may be a distributed data processing system in which multiple computing devices are utilized to perform various aspects of the present invention. Therefore, the following FIGS. 1 and 2 are provided as exemplary diagrams of data processing environments in which the present invention may be implemented. It should be appreciated that FIGS. 1 and 2 are only exemplary and are not intended to assert or imply any limitation with regard to the environments in which the present invention may be implemented. Many modifications to the depicted environments may be made without departing from the spirit and scope of the present invention.

With reference now to the figures, FIG. 1 is an exemplary pictorial representation of a network of data processing systems in which the present invention may be implemented. Network data processing system 100 is a network of computers in which the present invention may be implemented. Network data processing system 100 contains a network 102, which is the medium used to provide communications links between various devices and computers connected together within network data processing system 100. Network 102 may include connections, such as wire, wireless communication links, or fiber optic cables.

In the depicted example, a server 104 is connected to network 102 along with storage unit 106. In addition, clients 108, 110, and 112 also are connected to network 102. These clients 108, 110, and 112 may be, for example, personal computers, network computers, or other computing devices. In the depicted example, server 104 provides data, such as boot files, operating system images, and applications to clients 108–112. Clients 108, 110, and 112 are clients to server 104. Network data processing system 100 may include additional servers, clients, and other devices not shown. In the depicted example, network data processing system 100 is the Internet with network 102 representing a worldwide collection of networks and gateways that use the TCP/IP suite of protocols to communicate with one another. At the heart of the Internet is a backbone of high-speed data communication lines between major nodes or host computers, consisting of thousands of commercial, government, educational and other computer systems that route data and messages. Of course, network data processing system 100 also may be implemented as a number of different types of networks, such as for example, an intranet, a local area network (LAN), a wide area network (WAN), or a wireless network. FIG. 1 is intended as an example, and not as an architectural limitation for the present invention.

FIG. 2 is a more detailed exemplary illustration of a stand-alone computer system or a computer system that may be used to implement any of the computer systems of FIG.

1 in accordance with the present invention. Data processing system 200 may be a symmetric multiprocessor (SMP) system including a plurality of processors 202 and 204 connected to system bus 206. Alternatively, a single processor system may be employed.

In the depicted example, processor 204 is a service processor. Also connected to system bus 206 is memory controller/cache 208, which provides an interface to local memory 209. I/O bus bridge 210 is connected to system bus 206 and provides an interface to I/O bus 212. Memory controller/cache 208 and I/O bus bridge 210 may be integrated as depicted.

Peripheral component interconnect (PCI) bus bridge 214 connected to I/O bus 212 provides an interface to PCI local bus 216. A number of modems may be connected to PCI bus 216. Typical PCI bus implementations will support four PCI expansion slots or add-in connectors. Communications links to network computers 108–112 in FIG. 1 may be provided through modem 218 and network adapter 220 connected to PCI local bus 216 through add-in boards.

Additional PCI bus bridges 222 and 224 provide interfaces for additional PCI buses 226 and 228, from which additional modems or network adapters may be supported. In this manner, data processing system 200 allows connections to multiple network computers. A memory-mapped graphics adapter 230 and hard disk 232 may also be connected to I/O bus 212 as depicted, either directly or indirectly.

Service processor 204 interrogates system processors, memory components, and I/O bridges to generate an inventory and topology understanding of data processing system 200. Service processor 204 also executes Built-In-Self-Tests (BISTs), Basic Assurance Tests (BATs), and memory tests on all elements found by interrogating a system processor, memory controller, and I/O bridge. Any error information for failures detected during the BISTs, BATs, and memory tests are gathered and reported by service processor 204.

Those of ordinary skill in the art will appreciate that the hardware depicted in FIG. 2 may vary. For example, other peripheral devices, such as optical disk drives and the like, also may be used in addition to or in place of the hardware depicted. The depicted example is not meant to imply architectural limitations with respect to the present invention.

As mentioned above, the present invention provides a mechanism for generating Steiner, or buffer, trees for routing of nets in an integrated circuit design and for buffer insertion which simultaneously performs blockage avoidance, delay optimization, and design density management. Each of these factors are important considerations when determining an optimum routing and buffer insertion solution for a particular integrated circuit design and topology.

Figure 3A:
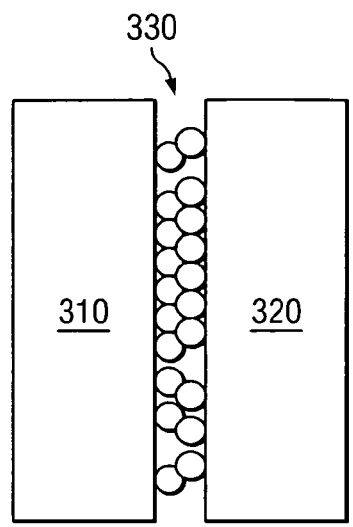
FIG. 3A illustrates the "alley" problem in which space is limited between two large fixed blocks.

Construction of thousands of buffer trees can potentially cause several design problems. FIG. 3A illustrates the "alley" problem in which space is limited between two large fixed blocks, or blockages. The space 330 between blocks 310 and 320 is highly desired by global routes that cross over the blocks 310 and 320. This leads to both placement and routing congestion. This becomes especially problematic if the "alley" is filled with buffers for non-critical nets that could have potentially avoided the "alley."

Figure 3B:
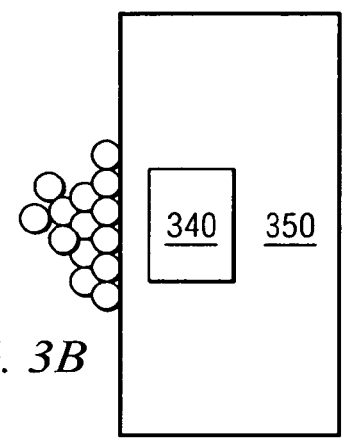
FIG. 3B illustrates the buffer "pile-up" phenomenon that occurs when constructing large numbers of buffer trees.

FIG. 3B illustrates the buffer "pile-up" phenomenon that occurs when constructing large numbers of buffer trees. As shown, several nets may desire buffers to be inserted in the region 340. However, this area is blocked by block 350. Because of this, the buffers are inserted as close to the boundary as possible. As more nets are optimized, these buffers pile up and spiral out further from their ideal locations. This could be avoided by only allowing buffers for the most critical nets to use these scarce resources.

Figure 4A:
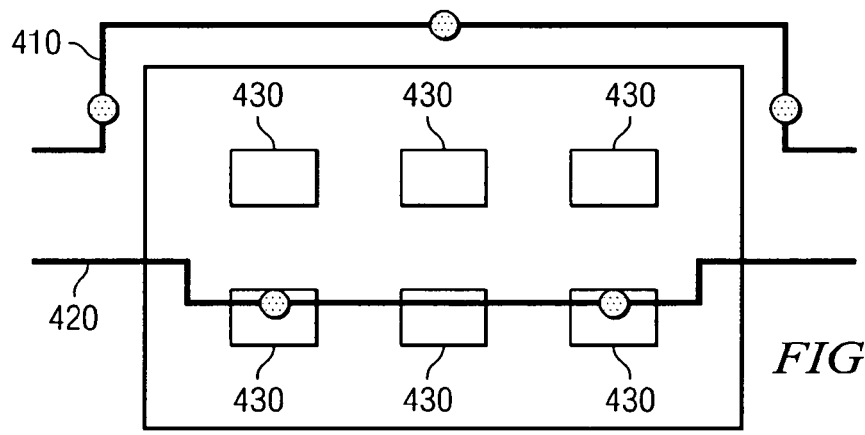
FIG. 4A is an exemplary diagram illustrating the manner by which spaces may be allocated within macro blocks for buffering of global nets.

As technology continues to scale, the optimum distance between consecutive buffers continues to decrease. In a hierarchical design, this means allocating spaces within macro blocks for buffering of global nets. An example is shown in FIG. 4A. As shown in FIG. 4A, the space for buffers is potentially limited. Therefore, non-critical nets, such as net 410, should be routed around the blocks while critical nets, such as net 420, may use the holes 430 in order to pass over the block. Long non-critical nets still require buffers to fix slew and/or capacitance violations. In addition, these nets could be critical, but have a wide range of possible buffering solutions that may bring them into the non-critical group.

Figure 4B:
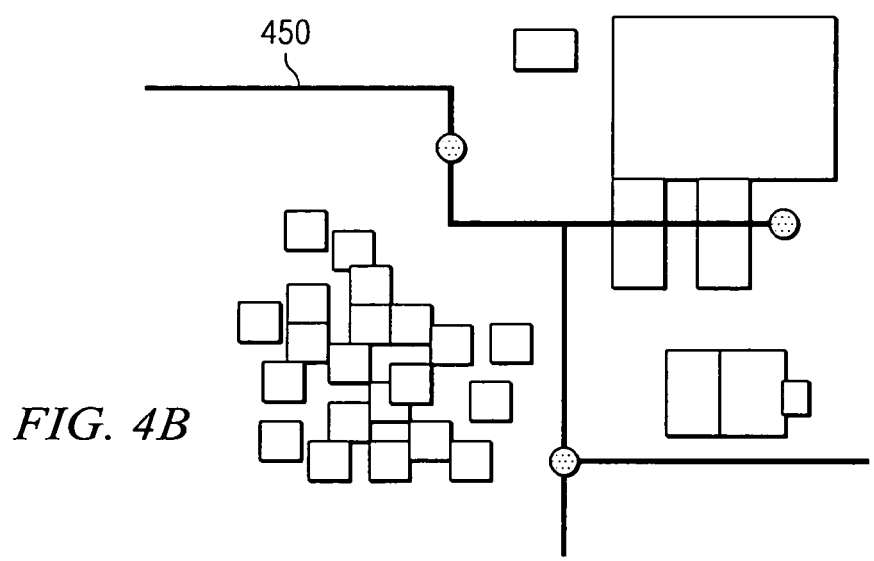
FIG. 4B is an exemplary diagram illustrating an integrated circuit design which has pockets of low density for which inserting buffers is preferred.

Even without holes in the block, as shown in FIG. 4B, designs may have pockets of low density for which inserting buffers is preferred. In FIG. 4B, the Steiner route 450 is located in the low density part of the chip, which makes the buffers inserted along the route also use low density regions.

Figure 4C:
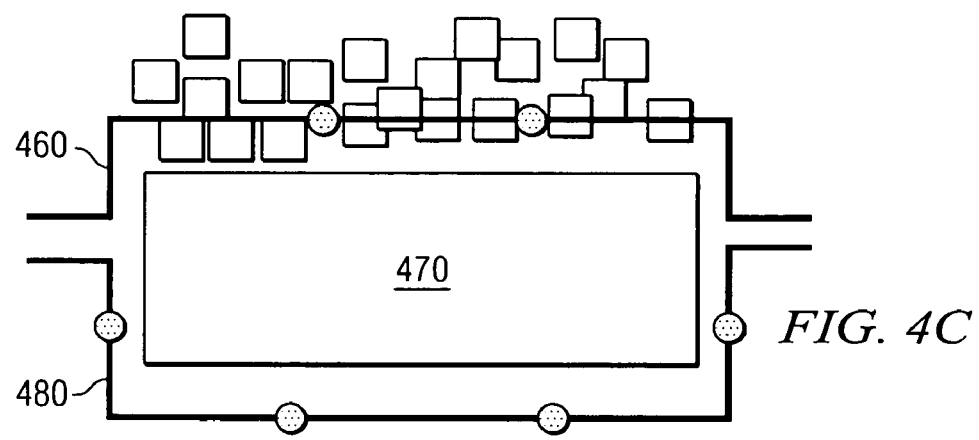
FIG. 4C is an exemplary diagram illustrating a case where one may be willing to insert buffers in high density regions if a net is critical.

FIG. 4C shows an example where one may be willing to insert buffers in high density regions if a net is critical. The 2-buffer route 460 above the block 470 yields faster delays than the 4-buffer route 480 below the block 470 that is better suited for non-critical nets.

Figure 4D:
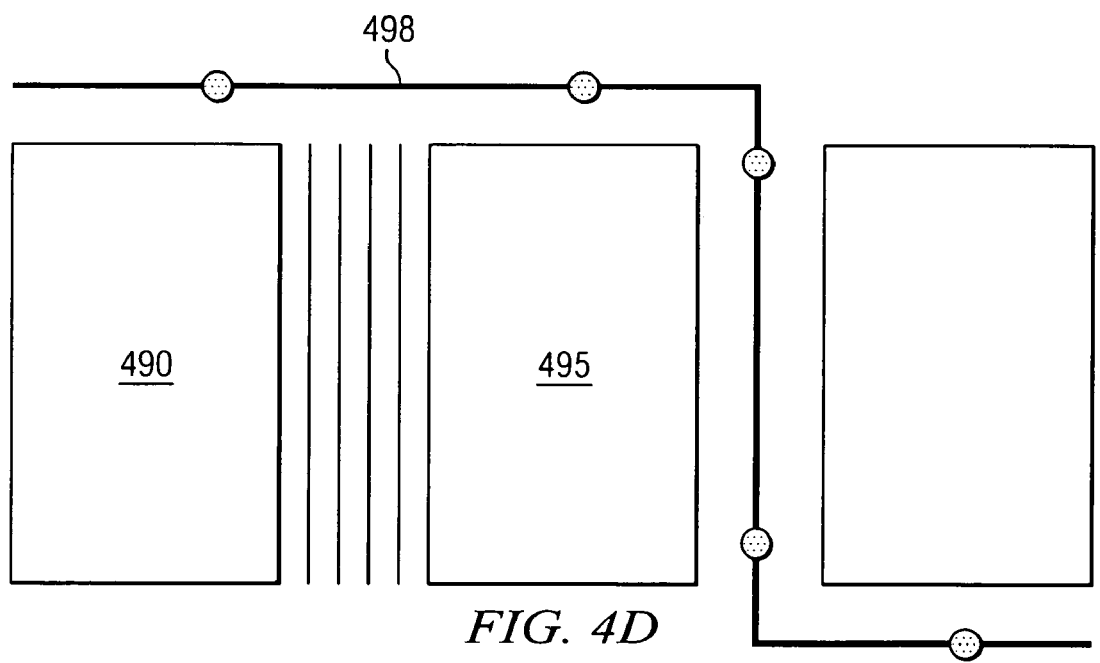
FIG. 4D is an exemplary diagram illustrating routing congestion between two blocks.

Finally, FIG. 4D shows routing congestion between two blocks 490 and 495. As shown, the preferred buffered route 498 avoids this congestion without sacrificing timing.

Most of the previous work on routing and buffer insertion that attempt to consider the environment focus on either avoiding large blockages or using a set of fixed buffer locations, which means that they do not handle the types of constraints shown in FIGS. 3A–B and 4A–D above. The present invention provides a mechanism for rerouting an initial Steiner tree taking into consideration the physical layout environment. Moreover, the present invention provides a mechanism for quantifying and determining how to resolve the tradeoff between timing and environmental considerations when optimizing routing and buffer insertion of nets in an integrated circuit design.

More specifically, the present invention provides mechanisms for differentiating between critical and non-critical nets when determining how to route these nets in view of blockages. The present invention further provides mechanisms for differentiating between critical and non-critical nets when determining how to route these nets through low and high density regions of the integrated circuit design. The present invention further provides mechanisms for placing limits on net slews while determining optimum routing of nets in view of blockages and high density areas of the integrated circuit design. Moreover, the present invention provides a mechanism for The present invention builds off of the Porosity Aware Buffered Steiner Tree (PABST) construction methodology described in commonly assigned and co-pending U.S. patent application Ser. No. 10/418,469 entitled "Porosity Aware Buffered Steiner Tree Construction," filed on Apr. 17, 2003. The PABST construction methodology involves first obtaining a timing-driven Steiner tree construction, then performing a plate-based adjustment of the Steiner tree based on porosity considerations, performing local blockage avoidance, and then performing a van Ginneken style buffer insertion. The present invention, hereafter referred to as BEN (Buffer trees that are Environmentally Navigated)

improves upon this methodology by providing mechanisms that make the PABST construction methodology more environmentally aware.

With the present invention, as with the PABST construction approach, a timing driven Steiner tree is first obtained that is ignorant of the environment. The Steiner tree is then rerouted to preserve its topology while navigating environmental constraints. Lastly, buffers are inserted using a resource-aware variant of van Ginneken's algorithm.

The obtaining of a timing driven Steiner tree is generally known in the art. Any methodology for obtaining a Steiner tree may be used without departing from the spirit and scope of the present invention. For example, in a preferred embodiment, the methodology described in Alpert et al., "Buffered Steiner Trees for Difficult Instances," IEEE Transactions on Computer-Aided Design, 21 (1):3–14, January 2002, which is hereby incorporated by reference, may be utilized to obtain a C-tree. The present invention then operates on this initial Steiner tree to obtain an optimally routed Steiner tree that takes into account the physical environment limitations.

After obtaining the initial timing-driven Steiner tree, the design area of the Steiner tree is divided into tiles where each tile has a cost reflecting its placement and/or routing congestion, or density. The Steiner tree is then broken into disjoint 2-paths, i.e. paths which start and end with either the source, a sink, or a Steiner point (an additional point that is not a source or a sink and is introduced to reduce the length of the Steiner tree) such that every internal node has degree two. This process is described in co-pending and commonly assigned U.S. patent application Ser. No. 10/738,714 entitled "Method and Apparatus for Performing Density-Biased Buffer Insertion in an Integrated Circuit Design", filed on Dec. 17, 2003, and hereby incorporated by reference.

Finally, each 2-path is re-routed in turn to minimize cost, starting from the sinks and ending at the source. The new Steiner tree is assembled from the new 2-path routes.

A key feature of the PABST construction methodology is that Steiner points are allowed to migrate from their original locations as long as they do not deviate outside of a specified "plate" region. The basic idea of this "plate-based" adjustment of the Steiner tree is to perform simplified simultaneous buffer insertion and local tree adjustment so that the Steiner points and wiring paths can be moved to regions with greater porosity, i.e. lower area and routing density, without significant disturbance on the timing performance obtained with the timing-based Steiner tree.

With PABST, the range of movement of the Steiner points is restrained by the "plates" which are defined as follows. For a node $v_i \in T(V,E)$ which is located in a tile $g_k$, where V is the set of vertices or nodes and E is the set of endpoints, i.e. sources and sinks, a plate P(vi) for $v_i$ is a set of tiles in the neighborhood of $g_k$ including $g_k$ itself. During the plate-based adjustment, the location change for each Steiner point is confined within its corresponding plate. If $v_i$ is a sink or the source, then $P(v_i)$ includes only the tile $g_k$. If $v_i$ is a Steiner point, then $P(v_i)$ is set to be a n×n array of tiles centered on $g_k$ where n is selected based on an acceptable runtime penalty. That is, the larger the value for n, the longer it will take for the PABST algorithm to generate a solution.

Figure 5A:
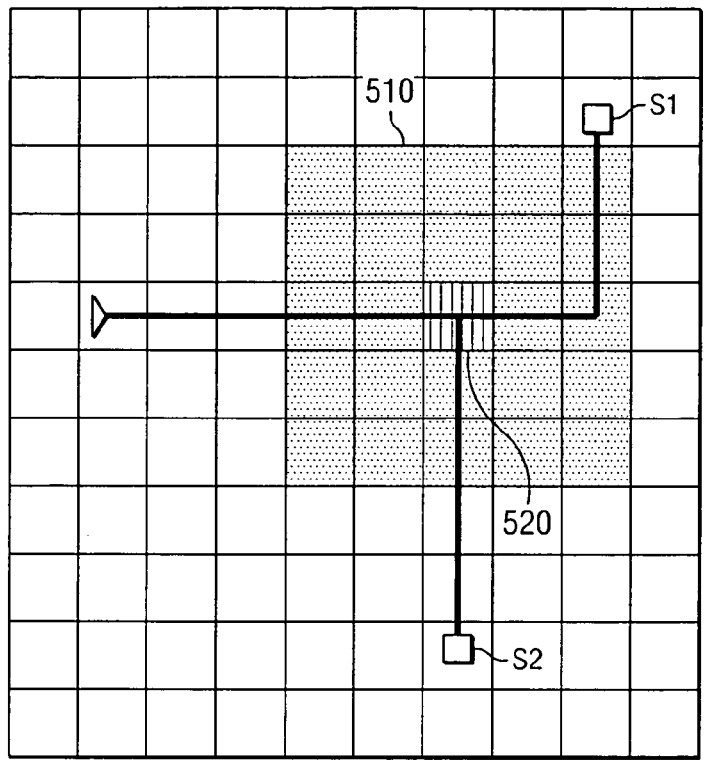
FIGS. 5A and 5B illustrate examples of plates, bounding boxes, and the re-routing performed by the PABST construction methodology.
Figure 5B:
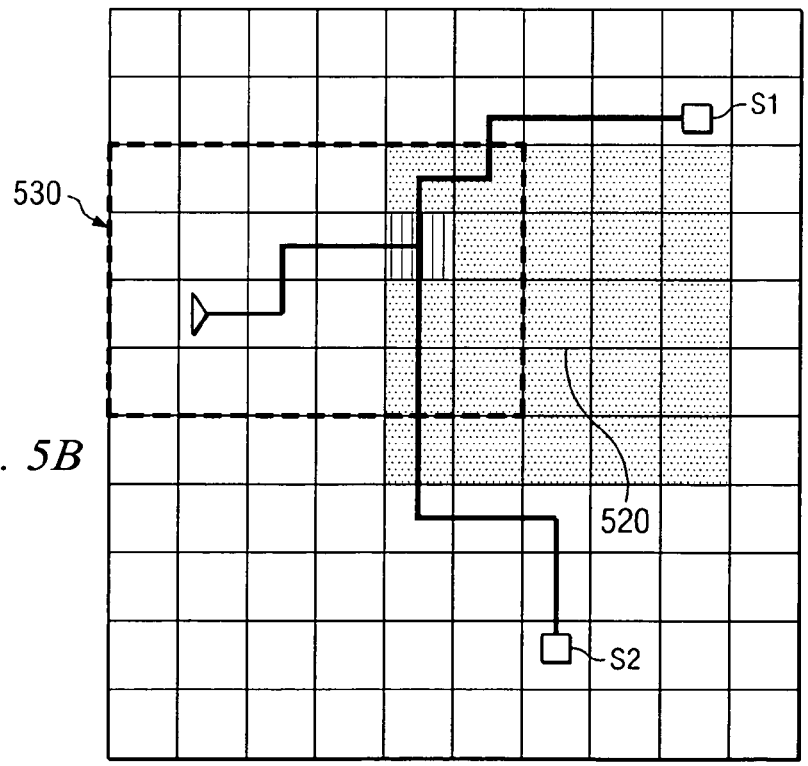

The search for alternate wiring paths is limited to the minimum bounding box covering the plates of two end nodes. FIGS. 5A and 5B illustrate examples of plates, bounding boxes, and the re-routing performed by the PABST construction methodology. As shown in FIGS. 5A and 5B, the plate 510 is illustrated as a shaded region with the tile 520 representing Steiner point at the center of the shaded region. In this case, n is selected to be 5 tiles such that the plate 510 is a 5×5 plate. The bounding box 530 represents the search area for re-routing of the 2-path from the Steiner point to the source. In the illustrated example, the bounding box has been expanded by one tile.

The PABST methodology accomplishes tile to tile routing by dynamic programming in which both a load and cost is propagated from one tile to the next. The plate-based adjustment of PABST traverses the given Steiner topology in a bottom-up fashion similar to van Ginneken's algorithm. During this process, Steiner nodes and wiring paths may be adjusted together with buffer insertion to generate multiple candidate solutions.

In summary, at each iteration of the rerouting operations, new candidate solutions are generated by propagating previous solutions to hierarchically higher points in the Steiner tree. Eventually, a set of optimal candidate solutions leading up to the source node (driver) of the original Steiner tree is obtained.

Each intermediate buffer solution is characterized by a 3-tuple s(v,c,w) in which v is the root of the subtree, c is the discretized load capacitance seen from v, and w is the accumulated porosity cost. A solution $s_i(v,c_i,w_i)$ is said to be dominated by another solution $s_j(v,c_j,w_j)$, if $c_i \geq c_j$ and $w_i \geq w_j$. A set of buffer solutions S(v) at node v is a non-dominating set when there is no solution in S(v) dominated by another solution in S(v). In a preferred embodiment, S(v) is arranged as an array $\{s_1(v,c_1,w_1), s_2(v,c_2,w_2), \ldots\}$ in ascending order according to the load capacitance. The basic operations of the rerouting and buffer insertion of PABST are:

AddWire($s_i(v,c_i,w_i)$,u): grow solution $s_i$ at v to node u by adding a shortest distance wire between them. Node u is either within the same tile as v or in the neighboring tile of v. If the wire has capacitance C, we can get $$c_j(u) = c_i(v) + \frac{C}{\beta}$$

and $w_j(u)=w_i(v)+w(v,u)$ where w(v,u) is the rectilinear distance between v and u, multiplied by the placement density and $\beta$ is a constant representing the capacitance of a wire to traverse one tile.

AddBuffer($s_i(v,c_i,w_i)$); insert buffer at v. If buffer b has an input capacitance $c_b$, output resistance $r_b$ and intrinsic delay $t_b$, then the buffered solution $s_j(v,c_j,w_j)$ is characterized by $c_j(v)=c_b/\beta$ and $w_j(v)=w_i(v)+p(g)$ in which $p(g)=[d(g)]^2$ is the porosity cost for tile g where node v is located.

Prune(S(v)): remove any solution $s_i \in S(v)$ that is dominated by another solution $s_j \in S(v)$.

Expand ($s_i(v,c_i,w_i)$,u): grow $s_i(v)$ to node u by AddWire to get solution $s_j(u,c_j,w_j)$, insert buffer for $s_j(u)$ to obtain $s_k(u,c_k,w_k)$. Add the unbuffered solution $s_j$ and buffered solution $s_k$ into solution set S(u) and prune the solutions in S(v).

Merge($S_l(v),S_r(v)$): merge solution set from left child of v to the solution set from the right child of v to obtain a merged solution set S(v). A solution $s_{i,l}(v,c_{i,l},w_{i,l})$ from the left child and a solution $s_{j,r}(v,c_{j,r},W_{j,r})$ are merged to obtain $s_k(v,c_k=c_{i,l}+c_{j,r},w_k=w_{i,l}+w_{j,r})$ only when $c_k \leq U$.

In a similar fashion to van Ginneken's algorithm, starting from the leaf (sink) nodes, candidate solutions are generated and propagated toward the source in a bottom-up manner. Before candidate solutions are propagated from node $V_i$ to its parent node $v_j$, plate $P(v_i)$ and plate $P(v_j)$ are found and a bounding box is defined, where the bounding box is the minimum-size array of tiles covering both $P(v_i)$ and $P(v_j)$. Then all of the candidate solutions from each tile of $P(v_i)$ are propagated to each tile of $P(v_j)$ within this bounding box.

It should be noted that branch nodes are allowed to be moved within the neighborhood defined by the node's plate. Since branch nodes are more likely to be buffer sites, due to the demand on decoupling non-critical branch load from the critical path, allowing branch nodes to be moved to less congested areas is especially important. Moreover, since such a move forms part of a candidate solution, the move will be committed only when its corresponding candidate solution is finally selected at the driver (i.e., at the root of the Steiner tree). Therefore, such move is dynamically generated and selected according to the request of the final minimum-porosity-cost solution.

A complete description of an exemplary embodiment of the core algorithm used in the PABST methodology is given in Table I below. A subroutine for solution propagation in the exemplary embodiment is provided in Table II.

As can be seen from Table I, the main algorithm is implemented as a left-recursive function "FindCandidates (v)." In Computer Science, a left-recursive function is a function that initially calls itself to obtain an intermediate result, then uses the intermediate result to complete the computation. One of ordinary skill in the art will appreciate that although the pseudocode representation provided in Table I is implemented as a left-recursive function, the pseudocode representation in Table I may be transformed using well-known techniques into a tail-recursive or iterative procedure.

Turning now to the pseudo-code function FindCandidates in Table I, for each node of the Steiner tree having children, FindCandidates first recursively calls itself on the children of that node (lines 2 and 5). When a sink (leaf) node is reached, an initial candidate solution set $S(P(v))$ containing a single solution $\{(v,0,0)\}$ is generated and returned as an intermediate result (line 1). Upon the return of an intermediate result from a left child node (or the only child node in the case of a single child), the Propagate subroutine is called with respect to the left/only child node to propagate candidate solutions from the child node's plate to the current node's plate (line 3). Similarly, if a node has two children, the Propagate subroutine is called again with respect to the right child node (line 6), and a Merge operation is performed to join the left and right children's solutions together into a single solution (line 7). Finally, the candidate solutions so obtained are returned (line 4 if only one child, or line 8 if two children).

TABLE I

Procedure: FindCandidates(v)

| | |
|---|---|
| Input: | Current node v to be processed |
| Output: | Candidate solution set S(P(v)) |
| Global: | Steiner tree T(V, E) |
| | Tile graph $G(V_G, E_G)$ |

1. If v is a sink
   $S(v) \leftarrow \{(v, 0, 0)\}$
   $S(P(v)) \leftarrow \{S(v)\}$
   Return S(P(v))
2. $v_l \leftarrow$ left child of v
   $S(P(v_l)) \leftarrow$ FindCandidates($v_l$)
3. $S_l(P(v)) \leftarrow$ Propagate(S(P($v_l$)), P(v))

TABLE I-continued

Procedure: FindCandidates(v)

4. If v has only one child
   Return $S_l(P(v))$
5. $v_r \leftarrow$ right child of v
   $S(P(v_r)) \leftarrow$ FindCandidates($v_r$)
6. $S_r(P(v)) \leftarrow$ Propagate(S(P($v_r$)), P(v))
7. $S(P(v)) \leftarrow$ Merge($S_l(P(v))$, $S_r(P(v))$)
8. Return S(P(v))

The Propagate subroutine in Table II handles the propagation of candidate solutions from the plate of a child node, $P(v_i)$ to the plate of the current node, $P(v_j)$. Propagate begins by initializing local variables (line 0). $S(P(v_j))$, the new candidate solution set to be generated is set to the empty set (Ø). A bounding box B is defined as the minimum bounding box of the two plates. A holding variable Q is initialized to the empty set (Ø). For performance purposes, Q may be implemented using a priority queue or heap data structure, such as a Fibonacci Heap, as described in Cormen, Leiserson, Rivest, and Stein, *Introduction to Algorithms, Second Edition*, MIT Press, 2001, pp. 476–497. In Table II, however, on line 1, the candidate solutions for each tile in $P(v_i)$ are added to Q. While Q is non-empty (line 2), lines 3–5 are executed in a loop. At each iteration of the loop, the minimum cost candidate solution in Q is extracted from Q and placed in variable s, and the tile representing the location of s (i.e., the last tile included in the candidate solution s) is assigned to variable $g_k$.

For each tile $g_l$ that is adjacent to $g_k$ (line 4), line 5 is executed. On line 5, if $g_l$ is within bounding box B, a new candidate solution $s_{new}$ is generated in which a wire is added to the solution in s to extend that solution to $g_l$. A buffered solution $s_{new,buf}$ is generated from $s_{new}$, in which a buffer is inserted at tile $g_l$. These new solutions ($s_{new}$ and $s_{new,buf}$) are added to the candidate solution set for $g_l$ (denoted $S(g_l)$) and to Q. Inferior candidate solutions in $S(g_l)$ are then pruned from $S(g_l)$, and these pruned solutions are also removed from Q. Finally, on line 6, the candidate solution set $S(P(v_j))$ is returned. (Note that by the time line 6 in Table II is executed, since all tiles in $P(v_j)$ will have been given candidate solutions on line 5, $S(P(v_j))$ will contain the appropriate solutions).

TABLE II

Procedure: Propagate(S(P($v_i$)), P($v_j$))

| | |
|---|---|
| Input: | Candidate solutions at P($v_i$)) |
| | Expansion region P($v_j$) |
| Output: | Candidate solution set S(P($v_j$)) |

0. $S(P(v_j)) \leftarrow \emptyset$
   B $\leftarrow$ bounding box of P($v_i$) and P($v_j$)
   Q $\leftarrow \emptyset$
1. For each tile $g_k \in P(v_i)$
   Q $\leftarrow$ Q $\cup$ S($g_k$)
2. While Q $\neq \emptyset$
3.    s $\leftarrow$ extract min cost solution in Q
      $g_k \leftarrow$ tile where s locates
4.    For each tile $g_l$ adjacent to $g_k$
5.      If $g_l \in$ B
          $S_{new}(g_l) \leftarrow$ AddWire(s($g_k$), $g_l$)
          $S_{new,buf}(g_l) \leftarrow$ AddBuffer($S_{new}(g_l)$)
          $S(g_l) \leftarrow S(g_l) \cup S_{new}(g_l) \cup S_{new,buf}(g_l)$
          Q $\leftarrow$ Q $\cup S_{new}(g_l) \cup S_{new,buf}(g_l)$
          Prune(S($g_l$))
          Remove pruned solutions from Q
6. Return S(P($v_j$))

The present invention uses the same overall strategy as PABST in order to perform re-routing of the Steiner tree, but the underlying plate-to-plate routing is performed in a different manner. The plate-to-plate routing is different from the PABST methodology in order to address concerns with the PABST methodology being too slow, tilings being too coarse, plates being too small, and distinctions between critical and non-critical nets being missing from the PABST methodology.

Within a known physical synthesis tool called Placement Driven Synthesis (PDS), buffer insertion typically takes 5–20% of the total CPU time. This running consists of constructing the timing-driven Steiner tree and performing buffer insertion. Adding the PABST mechanism to perform re-routing prior to buffer insertion causes the total CPU time of physical synthesis to more than double. While this may be tolerable in some instances, it is too severe for large scale usage.

Because PABST optimizes more than one criteria at a time, multiple solutions may be generated for each tile. While some of these solutions may die out after it is known that they are inferior, there is still a likelihood that each tile will produce more than one possible solution. Since each tile produces a plurality of possible solutions, the total number of possible solutions that must be processed is quite large. This causes the PABST mechanism to greatly increase the processing time to perform routing and buffer insertion.

The present invention reduces the amount of CPU time of physical synthesis by limiting the number of candidates per tile to one. In order to limit the number of solutions per tile, each tile has a cost that reflects its environment. In particular, the cost of potentially inserting a buffer and routing through the tile is represented by this cost value. Thus, for example, let e(t) be the environmental cost of using tile t, where zero is for a free tile and one represents a fully utilized tile.

In a preferred embodiment of the present invention, area density and routability are utilized as measures of the environment of a tile, although other measures of the environment may be utilized without departing from the spirit and scope of the present invention. Area density d(t) is defined as the area of a tile occupied by logic cells in the tile, divided by the total area of the tile. Routability r(t) is defined as the total number of tracks in the tile that are used, divided by the total tracks available in the tile.

Using these environmental variables, the environmental cost may be defined as:

$$e(t)=\alpha d(t)^2+(1-\alpha)r(t)^2 \text{ for } 0 \leq \alpha \leq 1 \qquad (1)$$

where α is a parameter that trades off between routing environmental cost and placement costs. The terms are squared in equation (1) above in order to increase the penalty as either the density or routing congestion becomes close to one. Of course other functions of density and routability, or other environmental variables, may be used to generate an environmental cost without departing from the spirit and scope of the present invention.

Having associated each tile with an environmental cost, the present invention generates net costs based on these environmental costs. The net costs are generated based on a combined cost equation that performs a tradeoff between critical and non-critical nets. Thus, if a net is critical, the portion of the net cost equation corresponding to critical nets will dominate. If a net is non-critical, the portion of the net cost equation that corresponds to non-critical nets will dominate.

In order to better understand the combined cost equation, the portions corresponding to critical and non-critical nets will first be described. The difference in cost determinations for critical versus non-critical nets is rooted in the primary concerns associated with these two different types of nets. With non-critical nets, the most important factor is the environmental costs since it is desirable for non-critical nets to avoid highly dense areas or routing congestion. However, it is still desirable to minimize wirelength to some degree in order to avoid electrical violations.

For critical nets, the cost impact of the environment is immaterial and it is timing that is of most importance. Thus, it may be desirable to route critical nets through densely packed tiles or areas where there is relatively large routing congestion in order to meet timing constraints.

Thus, for non-critical nets, the cost function that is used to generate a cost for a tile may be:

$$\text{cost}(t)=1+e(t) \qquad (2)$$

Which implies that a tile blocked for routing and/or density reasons has a cost that is twice that of a tile that uses no resources. In this way, tiles that have lower density and lower routing congestion are favored. The constant of one can be viewed as a "delay component" which will be discussed in greater detail hereafter.

A tile that corresponds to a Steiner point must accumulate the costs of the left and right child 2-paths into a single cost. If the cost for the left child 2-path is cost (L) and the cost for the right child 2-path is cost (R), then the merged cost function is:

$$\text{cost}(t)=\text{cost}(L)+\text{cost}(R) \qquad (3)$$

Since these are non-critical nets, all sinks are treated equally by having initial costs of zero. It should be appreciated that the above cost equations are only exemplary and other cost equations may be used without departing from the spirit and scope of the present invention. The main factor is that for non-critical nets, the cost function that is utilized should emphasize the affects of the environment of the integrated circuit design on the desirability of routing and buffer insertion in the corresponding tile.

With critical nets, the absolute best possible slack is desired. When a net is optimally buffered (assuming no obstacles), its delay is a linear function of its length. Thus, to minimize delay, the present invention minimizes the number of tiles to the most critical sink. Thus, the cost function for tiles with critical nets is:

$$\text{cost}(t)=1 \qquad (4)$$

When merging branches of a Steiner point in a critical net, the costs for the branch with the worst slack is selected so that the merged cost is:

$$\text{cost}(t)=\max(\text{cost}(L), \text{cost}(R)) \qquad (5)$$

To initialize the slack, a notion of which sink is critical is needed. Since the cost function basically counts tiles as delay, the required arrival time (RAT) at a sink is converted to a number of tiles by dividing the RAT by a minimum delay per tile (DpT) achievable on an optimally buffered net. Thus a sink's (s) initial cost is determined by:

$$\text{cost}(s)=-RAT(s)/DpT \qquad (6)$$

The more critical the sink, the higher its initial cost. The objective is to minimize cost at the source.

Figure 6A:
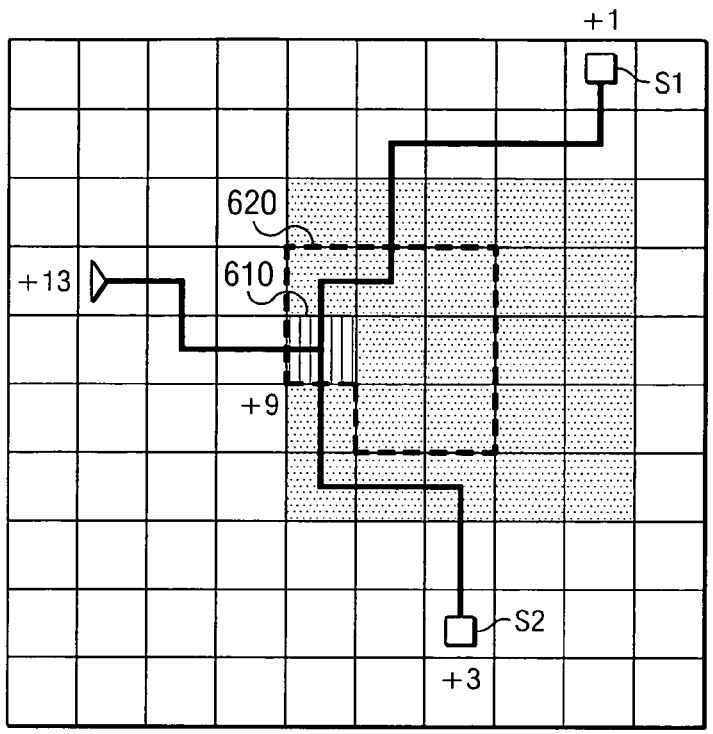
FIG. 6A is an exemplary diagram illustrating the re-routing of a net using a critical net cost function in accordance with the present invention.
Figure 6B:
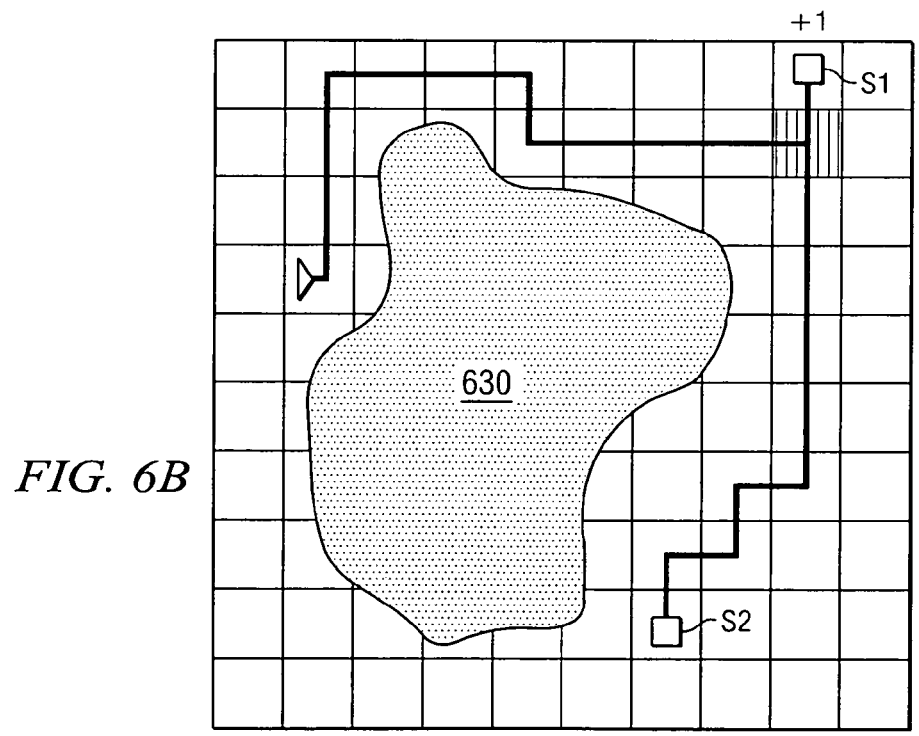
FIG. 6B is an exemplary diagram illustrating the re-routing of a net using a non-critical net cost function in accordance with the present invention.

As an example of how the cost functions for the critical and non-critical nets may generate differing results, consider the examples shown in FIGS. 6A and 6B. FIG. 6A represents the re-routing of a net using a critical net cost function. FIG. 6B represents the re-routing of a net using a non-critical net cost function.

With reference to FIG. 6A, assume that the RAT for sink s1 is −100 ps and the RAT for s2 is −300 ps. Further, assume that an optimally buffered net takes 100 ps to cross a tile, i.e. DpT=100. Based on these values, the initial cost of sink s1 is 1 and the initial cost of sink s2 is 3. This means that sink s2 is more critical than the sink s1. The cost function guarantees a shortest path from the source to the sink s2.

One of the possible solutions using the critical net cost function is shown in FIG. 6A. The Steiner point 610 could have been chosen from any within the dotted region 620 in order to minimize the cost at the source. The cost at the source is 13 and the cost at the Steiner point 610 is 9. The tile in the lower left corner of the plate cannot be chosen since it would increase the length of the route to the top sink by too much (that is, the tile in the lower left were selected, while the pathlength between the sink S2 and the source would still be 10 tiles and thus, the cost at the source would still be 13, the pathlength from the sink S1 to the source would be 14, for a total cost of 15 at the source which would make the path from sink S1 to the source critical).

FIG. 6B shows what re-routing would take place using the non-critical cost function in which the region 630 represents an area of high cost. FIG. 6B essentially shows that when there are areas of large cost, such as the region 630 shown in the center of FIG. 6B, it is sometimes beneficial to route around the areas of large cost when routing around the area of large cost results in a lower total cost. For example, if e(t) is 1.0 for tiles inside the region 630 (i.e. there is a total blockage of these tiles) and 0.2 for tiles outside the region 630, then the non-critical cost for tiles inside the region 630 is 2 and the cost for tiles outside the region 630 is 1.2. As a result, if cost at the source is less by routing around the region 630 as opposed to routing over the region 630, the route around the region 630 will be selected. In addition, because of slew constraints and required buffer insertion points, the path around the region 630 may be selected even if the path over the region 630 results in less cost, as discussed hereafter.

As mentioned above, the present invention uses a cost function that provides a tradeoff between the critical and non-critical cost functions described above. This general cost function, which is utilized in a similar manner as the cost function in the PABST methodology, is determined as follows. Let K be the trade-off parameter where $0 \leq K \leq 1$. A non-critical net corresponds to K being equal to 1. A critical net corresponds to K being equal to zero. In this way, the general cost function may be devised as:

$$\text{cost}(t) = 1 + K * e(t) \qquad (7)$$

For critical nets, merging branches is a maximization function while it is an additive function for non-critical nets. These ideas can be combined with K to yield:

$$\text{cost}(t) = \max(\text{cost}(L), \text{cost}(R)) + K * [\min(\text{cost}(L), \text{cost}(R))] \qquad (8)$$

Finally, the sink initialization formula becomes:

$$\text{cost}(s) = (K-1) RAT(s)/DpT \qquad (9)$$

Thus, K trades off the cost function, the merging operation, and sink initialization. In practice, K may be used iteratively to obtain an optimum re-routing of the initial timing-driven Steiner tree. For example, all nets that need buffering in the integrated circuit design may be optimized using K=1 which limits the use of scarce resources. After performing a timing analysis, those nets that still have negative slack can be re-optimized with a smaller value of K, e.g., K=0.7. This process of re-optimizing and gradually reducing K can continue until K reaches some minimum value, e.g., K=0.1.

Thus, by iteratively adjusting K and re-optimizing the nets, both non-critical nets and critical nets are optimized in accordance with the primary concerns associated with these nets, e.g., environmental affects (non-critical) and timing (critical). Non-critical nets are optimized such that they are routed through less dense regions of the integrated circuit design and thus, buffers are inserted in less dense regions of the integrated circuit design. Critical nets are optimized such that they may be routed through more densely packed areas of the integrated circuit design when necessary so as to achieve required timing requirements.

In addition to the cost function used above that trades-off between critical and non-critical cost functions, the present invention provides other improvements to the PABST methodology. One such improvement is the use of a slew threshold constraint.

Figure 7A:
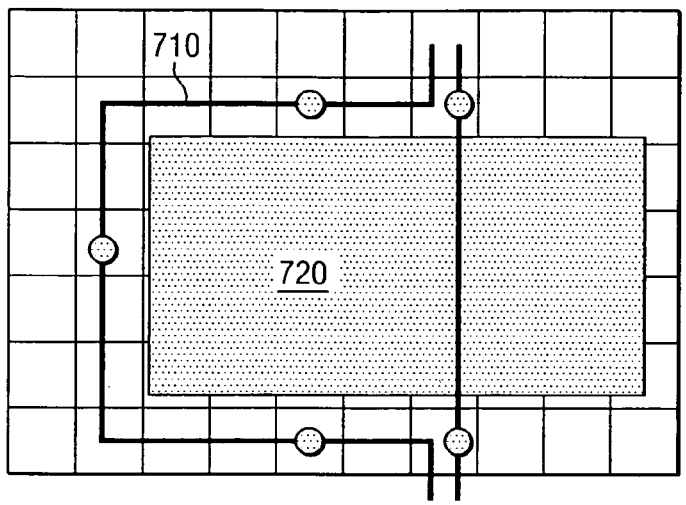
FIG. 7A is an exemplary diagram illustrating a non-critical net in which there is no routing congestion for purposes of explaining the need for a slew constraint.

In order to understand the need for a slew threshold constraint, consider the non-critical net illustrated in FIG. 7A in which there is no routing congestion. As shown in FIG. 7A, the block 720 is a blockage in which buffers cannot be inserted and thus, the non-critical net 710 is routed around the blockage 720. If the detour is long enough, however, then the non-critical cost function will prefer the solution that goes over the block. For example, assume that the environmental cost for tiles within a blockage is 1.0 and the cost for tiles outside the blockage is 0.2. The total cost per tile for tiles within the blockage is 2 and the total cost for tiles outside the blockage is 1.2. If the pathlength between the sink and the source is 10 tiles when traversing the blockage, the total cost at the source is 10*2=20. If the pathlength between the sink and the source is 15 tiles when routing around the blockage, then the total cost at the source is 15*1.2=18. In this case, routing around the blockage is preferred. However, if the total length around the blockage were 20, then routing over the blockage would be preferred.

However, making this jump over the blockage may prevent the net from fixing a slew violation. That is, because buffers cannot be inserted into tiles that are blocked by the blockage, the electrical signal may degenerate beyond a threshold. This would not be an acceptable solution and thus, routing around the blockage would be preferred even though the total cost may be higher.

A fixed slew constraint on every gate in the design is required to ensure a reasonable initial timing and to maintain signal integrity. This slew constraint can be translated into a length constraint either empirically or analytically, which can be converted to a number of tiles T. In the depicted example of FIG. 7A, the slew constraint is T<4, i.e. if the number of tiles is less than 4 then the route going over the blockage is not permitted. That is, a minimum spacing of buffers is 4 tiles in order to ensure an appropriate slew.

To enforce the slew threshold constraint during re-routing, the number of consecutive blocked tiles B(t) a solution for tile t has seen to date along a candidate net route is stored. A tile t is blocked if its density d(t) is 1 or greater (i.e. the tile could be temporarilty "overstuffed" with logic cells). When a new tile t' is encountered that is blocked, B(t') is set to B(t)+1. When t' is unblocked, B(t') is set to 0.

Figure 7B:
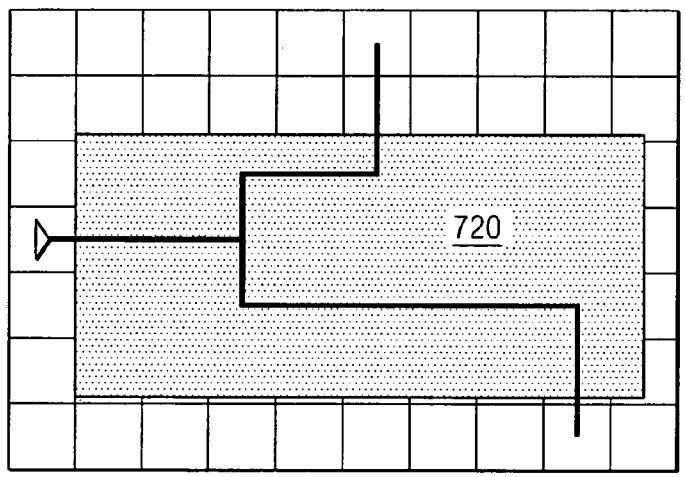
FIG. 7B is another exemplary diagram illustrating a routing over a blockage used to explain the manner by which a slew constraint is utilized in the present invention.

Let TL and TR be the number of consecutive blocked tiles on the left and right branches from a Steiner point t. To computer the consecutive blocked tiles from a Steiner point, one could use B(t)=TL+TR. In FIG. 7B, TL=4 and TR=8, so for the source s, B(s)=15. If T=13, then this Steiner route is not permissible. This is somewhat pessimistic since the longest blocked path is just 11 tiles. However, if one uses B(t)=max (TL, TR), this leaves a value of B(s)=11, which ignores the potential extra capacitance of the left branch. As a compromise, B(t) may be equal to the mean square root of $TL^2+TR^2$. At the Steiner point, B(t)=sqrt($4^2+8^2$)=8.9 and B(s)=8.9+3=11.9. This provides a reasonably good model of the capacitance required by the driving buffer to meet its slew constraint.

Figure 8:
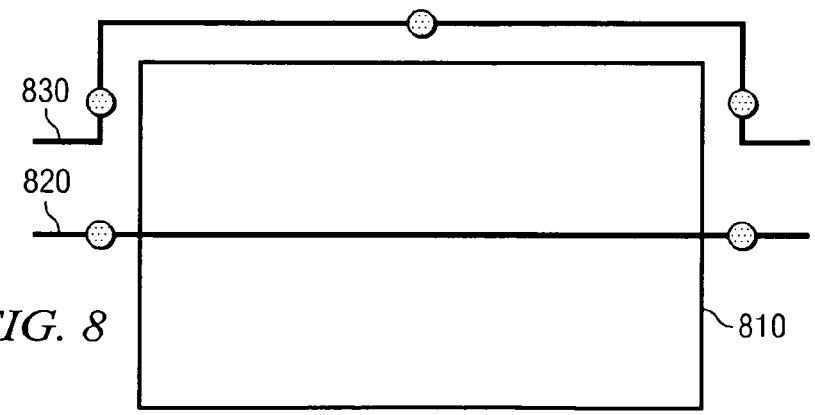
FIG. 8 is an exemplary diagram illustrating routing of nets over and around a blockage for purposes of explaining the need for a tile delay cost component in accordance with the present invention.

In addition to the slew constraint improvement discussed above, the present invention further provides a delay cost function for critical nets in order to address the situation where a linear delay may not be achievable. For example, as shown in FIG. 8, if a large block 810 exists over the route, the critical net will be routed with a straight shot 820 instead of around the block 810, as in net 830, since the distance is shorter. A large enough block 810 causes the buffers to be spaced further than optimal, i.e. the route around the block may be faster than the route through the block.

One solution to this problem is a tight slew constraint. If the optimum tile spacing between buffers is L, and the slew constraint is T, then if T=L, the rout that goes over the block is forbidden and the route will be forced to go around. Using T=L is unnecessarily restrictive, however.

Assume that T is greater than L and that the width W of the block lies between L and T. If W is close to L, then routing over the block 810 may yield the best solution for delay. If W is closer to T, the route around the block 810 may be preferred. This trade-off is characterized by a tile delay cost term added to the combined or general cost function previously discussed above.

The problem of estimating delay given that the route may cross over blocks of varying size is quite difficult, however this problem may be simplified when realizing that it does not matter where blockages appear on a net—it is only the size of the blocks that affect delay. Further, one can safely ignore any blocks with a width W that is less that the optimum tile spacing between buffers L since van Ginneken's algorithm is smart enough to choose the size buffers as necessary if blockages force irregular buffer spacing. An optimal buffering of a net that crosses a block with width W greater than L will almost assuredly have a buffer inserted right before and right after the block. Hence, one can use a linear delay model for the route whenever traversing blocks with width less than L and use the Elmore delay otherwise.

These conclusions imply that the correct cost of a tile for critical nets is still one when the number of consecutive blocked tiles B(t) is less than L. However, each subsequent blocked tile after L becomes increasingly expensive. Because delay is quadratic in unbuffered wirelength, the cost function of each additional tile increases with the derivative of delay. FIG. 9 illustrates the tile delay cost term function, which is referred to herein as TDC(B(t)). The general cost equation thus, becomes:

$$\text{cost}(t)=1+K*e(t)+(1-K)*TDC(B(t)) \qquad (10)$$

Using the prefix (1−K) reduces the impact of the tile delay cost as the net becomes less critical.

Since the present invention uses simple maze routing instead of dynamic programming, the present invention can use a finer tiling and explore a much larger solution space than the PABST mechanism. The present invention expands the searchable routing regions based on the actual environmental constraints. If a region cannot be buffered or routed, the present invention expands the search space sufficiently to explore solutions that avoid the blocked tiles.

The present invention may also use diamond or other geometric shaped plates as opposed to the square ones used by the PABST mechanism. A diamond is a Manhattan circle and more accurately reflects the region one needs to explore to move a Steiner point to an alternate location.

In order to demonstrate the manner by which the behavior of the present invention changes as a function of K, a test case from an industry design with 70 thousand objects was utilized. The cells were spread out and a large block was inserted into the design to create a placement obstacle. In addition, small holes were punched in the block to create areas where buffers could be inserted.

A total of 500 nets (with 5204 total sinks) were run on this design using different values of K to see how K affects performance. The value of K was varied from 1.0 to 0.0. The resulting number of buffers and slack improvement is shown in Table III below. When K was set to 1.0, the routing of the net completely avoided the blockage. When K was set to 0.1, the routing of the net successfully found the holes in the blockage and placed buffers in them where the routing deemed it appropriate.

TABLE III

Slack Improvement for Various Values of K

| Case | # Buffers | Slack imp |
| --- | --- | --- |
| Baseline | 1477 | 1849 ps |
| K = 1.0 | 1975 | 2072 ps |
| K = 0.9 | 1967 | 2081 ps |
| K = 0.8 | 1947 | 2085 ps |
| K = 0.7 | 1932 | 2093 ps |
| K = 0.6 | 1926 | 2108 ps |
| K = 0.5 | 1927 | 2103 ps |
| K = 0.4 | 1922 | 2084 ps |
| K = 0.3 | 1917 | 2118 ps |
| K = 0.2 | 1923 | 2120 ps |
| K = 0.1 | 1930 | 2118 ps |
| K = 0.0 | 3333 | 1884 ps |

The baseline in Table III represents only generating the timing-driven Steiner tree and then performing buffer insertion without rerouting according to the present invention. As shown in Table III, each buffering approach significantly improves slack for all nets. The improvement for the baseline is lower compared to the other results since it cannot find the holes in the block. Also, the present invention returns poor solutions for K=0.0 since it completely ignores the environment of the integrated circuit design. It is noted that there is a general improvement in slack and reducing in total number of buffers as K decreases. The latter effect is caused by more direct Steiner routes. By the time K reaches 0.3, the value of reducing K any further is not noticeable. In practice, from the above, K may be set to 0.1 for the most critical nets and to 1.0 for non-critical nets.

Next, an industrial Application Specific Integrated Circuit (ASIC) design with about 330 thousand objects was considered. 1000 long nets with 2074 total sinks to buffer were selected. The sinks were buffered in three different modes: mode 1—no environmental navigation, i.e. rerouting based on environmental costs, according to the present invention (referred to as BASE); mode 2—K set to 0.1 (referred to as CRIT), and mode 3—K set to 1.0 (referred to as ELEC). Each mode was run on four different size tilings of the chip.

FIG. 9 shows the total number of buffers, average slack improvement, total CPU time for generating the timing driven Steiner tree (Steiner), performing re-routing based on environmental costs (BEN), and performing van Ginneken-based buffer insertion (VG). The results improve as the number of rows increase from 83 to 166, yet for finer tilings, BEN does not improve performance. As shown, the slack improves more for CRIT than ELEC. For tilings with 166 rows and above, ELEC outperforms BASE because it avoids obstacles that force buffers to be spaced too far apart. Note that BEN is much faster than Steiner or VG for coarse tilings and it is still reasonable even for very fine tilings.

The additional runtime for van Ginneken's algorithm for ELEC and CRIT is caused by their ability to avoid blocks which leads to additional potential buffer insertion locations. This extra runtime for VG could be mitigated by more careful selection of potential buffer locations. For example, the buffer insertion locations may be selected using a density aware methodology such as that described in commonly assigned and co-pending U.S. patent application Ser. No. 10/738,714.

FIG. 10 shows how well the present invention utilized resources for the tiling with 249 rows. For this tiling, BASE, ELEC and CRIT insert 5871, 7299 and 7137 buffers, respectively. For each inseration in a tile t, the e(t) cost is recorded. The distribution of all buffer insertions as a function of e(t) is shown in FIG. 10. For example, for tiles with cost between 95% and 99.99%, BASE, ELEC and CRIT insert 318, 25 and 144 buffers, respectively. One can see that both ELEC and CRIT are more successful at inserting buffers in lower cost tiles than BASE. ELEC conserves resources better than CRIT due to its more environmentally aware cost function.

Thus, the present invention provides a mechanism by which an optimal routing and buffer insertion Steiner tree may be constructed using simultaneous blockage avoidance, delay optimization, and design density management. The present invention improves upon the methodology of PABST in that a more environmentally aware cost function is provided that provides a trade-off between critical and non-critical net costs. A slew constraint is also provided that aids in avoiding blockages that would cause sub-optimal buffer spacings. In addition, a tile delay cost is provided that accurately reflects the cost increase as the number of tiles between buffers increases beyond an optimum spacing. Because the present invention replaces the dynamic programming approach of PABST with a simple maze routing, the present invention may be executed faster and thus, use less CPU resources to complete the optimization.

Figure 11:
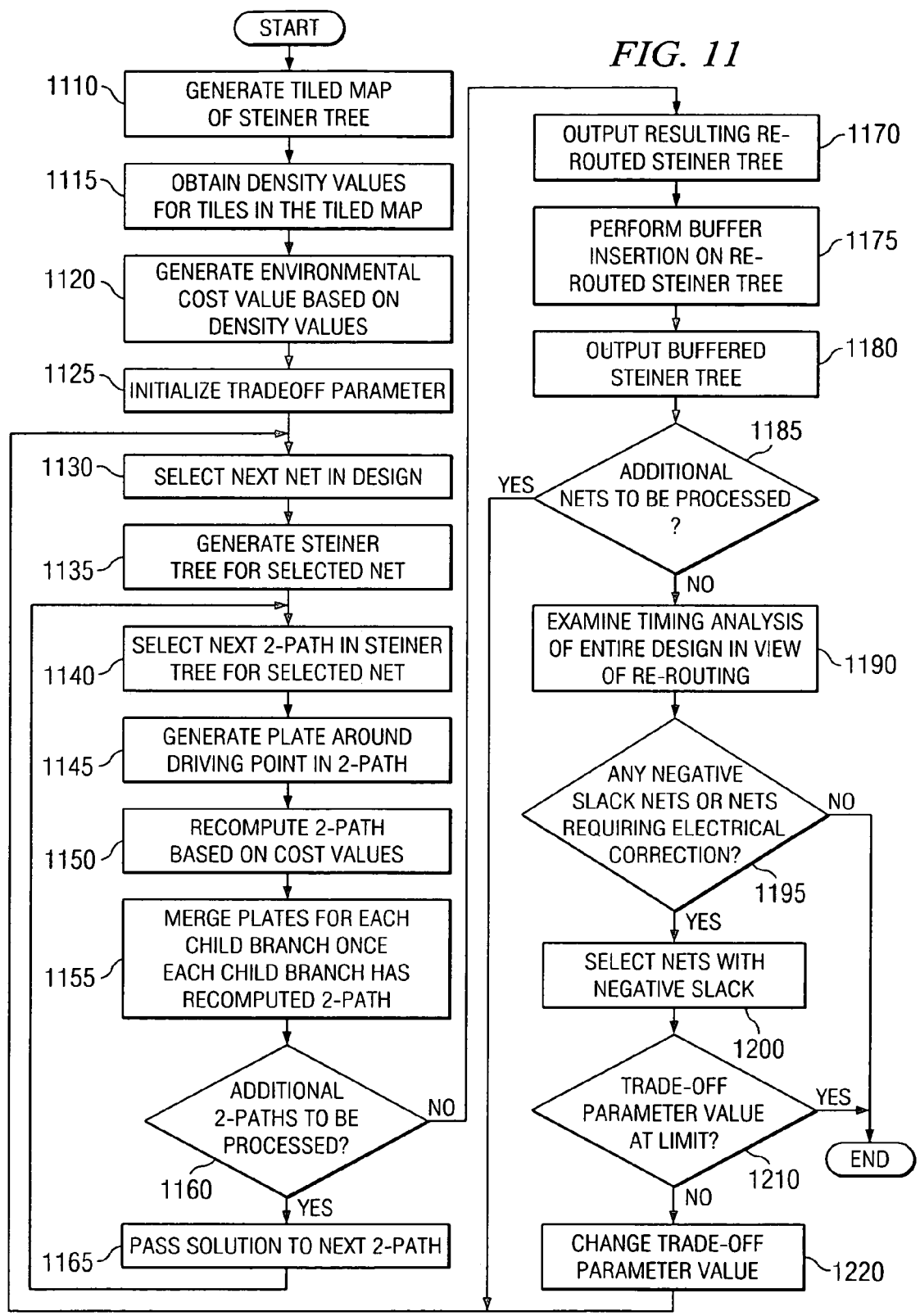
FIG. 11 is a flowchart outlining an exemplary operation of the present invention.

FIG. 11 is a flowchart outlining an exemplary operation of the present invention when generating an optimum Steiner tree construction using simultaneous blockage avoidance, delay optimization and design density management. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 11, the operation starts by generating a tiled map of a circuit design (step 1110). Area and routing density values for the tiles in the tiled map are then computed (step 1115). An environmental cost value is then generated based on the area and routing density values (step 1120). A trade-off parameter is then initialized to an initial value, e.g., 1.0 (step 1125).

Select a next net in the integrated circuit design (step 1130). A Steiner tree for the selected net is then generated (step 1135). A next 2-path in the Steiner tree for the selected net is selected (step 1140). A plate surrounding a driving point in the 2-path is determined (step 1145) and the 2-path is then recomputed based on cost values associated with each tile in the plate (step 1150). Plates for each child branch may then be merged once each child branch has a recomputed 2-path (step 1155).

A determination is then made as to whether additional 2-paths are present that need to be processed (step 1160). If there are additional 2-paths, then the solution from step 1155 is passed to the next 2-path which uses the solution from step 1155 as the new location of the Steiner point (step 1165) and the operation returns to step 1140.

If there are no additional 2-paths, the resulting re-routed Steiner tree that contains the recomputed 2-paths is output (step 1170). Buffer insertion is then performed on the re-routed Steiner tree (step 1175) and the buffered Steiner tree is output (step 1180).

A determination is then made as to whether there are additional nets to be processed (step 1185). If so, the operation returns to step 1130. If there are no additional nets to be processed, a timing analysis of the entire circuit design is examined in view of the recomputed nets (step 1190). A determination is then made as to whether there are any nets in the integrated circuit design that have negative slack or need electrical correction (step 1195). Those nets are then selected (step 1200).

A determination is made as to whether the trade-off parameter's value is at a minimum value (or maximum value, depending on the implementation) (step 1210). If not, the value of trade-off parameter is incremented, or decremented depending upon the particular implementation (step 1220), and the operation returns to step 1130 where a next net of the set of nets whose slack is still negative is selected. If the trade-off parameter value is at a minimum or maximum value, or if there are no nets that have negative slack, the operation terminates.

The result of the present invention is an optimized Steiner tree construction that takes into consideration blockages, the criticality of the nets, the area and routing densities of regions in the integrated circuit design, delay costs for critical nets passing through blocks, slew constraints, and the like. This optimized Steiner tree may be used to perform the actual routing and buffer insertion for an integrated circuit. Thus, the buffered Steiner tree that may result from the application of the present invention to an integrated circuit design, may be used to actually generate the integrated circuit in a manner generally known in the art. In this way, the design of integrated circuits is optimized while taking into account the physical environment in which the wirings are to be placed.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMS, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for optimizing routing and buffer insertion in an integrated circuit design, comprising:
    generating an initial timing-driven Steiner tree connecting a source node to at least one sink node in an integrated circuit design, wherein the initial timing-driven Steiner tree is generated without accounting for densities of regions in the integrated circuit design;
    dividing the initial timing-driven Steiner tree into a plurality of tiles;
    associating a cost with each tile of the plurality of tiles, wherein the cost includes a timing component and an environmental component; and
    adjusting a portion of the topology of the initial timing-driven Steiner tree based on the cost associated with each tile in the plurality of tiles, thereby generating an adjusted Steiner tree topology.

2. The method of claim 1, further comprising:
    setting a trade-off value for determining a trade-off between the timing component and the environment component of the cost associated with each tile, wherein associating a cost with each tile includes calculating a cost for each tile based on the setting of the trade-off value.

3. The method of claim 2, further comprising:
    iteratively changing the setting of the trade-off value, associating costs with tiles in the plurality of tiles based on the iteratively changing setting of the trade-off value, and adjusting the portion of the Steiner tree topology.

4. The method of claim 1, wherein the environmental component includes an area density component and a routing density component.

5. The method of claim 1, wherein the timing component includes a tile delay cost component representing a cost associated with deviating from an optimum spacing between buffer insertion points.

6. The method of claim 1, wherein associating a cost with each tile includes generating a cost value for each tile based on the following equation:

$$\mathrm{cost}(t) = 1 + K^* e(t) + (1-K)^* TDC(B(t))$$

where t is the tile, cost(t) is the cost associated with the tile, K is a trade-off value, e(t) is an environmental cost associated with the tile t, and TDC(B(t)) is a tile delay cost associated with the tile.

7. The method of claim 1, further comprising:
    inserting buffers into the adjusted Steiner tree topology to generate a buffered Steiner tree topology.

8. The method of claim 2, wherein adjusting a portion of the topology of the initial timing-driven Steiner tree based on the cost associated with each tile in the plurality of tiles, further includes:
    determining if any nets in the portion of the topology of the initial timing-driven Steiner tree have negative slack or require electrical correction after adjusting the portion of the topology of the initial timing-driven Steiner tree;
    modifying the trade-off value in response to a determination that at least one net in the portion of the topology of the initial timing-driven Steiner tree has negative slack or requires electrical correction after having been adjusted; and
    readjusting the at least one net based on the modified trade-off value and the cost associated with each tile in the plurality of tiles.

9. The method of claim 7, using the buffered Steiner tree topology to generate an integrated circuit.

10. A computer program product in a computer readable medium for optimizing routing and buffer insertion in an integrated circuit design, comprising:
    first instructions for generating an initial timing-driven Steiner tree connecting a source node to at least one sink node in an integrated circuit design, wherein the initial timing-driven Steiner tree is generated without accounting for densities of regions in the integrated circuit design;
    second instructions for dividing the initial timing-driven Steiner tree into a plurality of tiles;
    third instructions for associating a cost with each tile of the plurality of tiles, wherein the cost includes a timing component and an environmental component; and
    fourth instructions for adjusting a portion of the topology of the initial timing-driven Steiner tree based on the cost associated with each tile in the plurality of tiles, thereby generating an adjusted Steiner tree topology.

11. The computer program product of claim 10, further comprising:
    fifth instructions for setting a trade-off value for determining a trade-off between the timing component and the environment component of the cost associated with each tile, wherein associating a cost with each tile includes calculating a cost for each tile based on the setting of the trade-off value.

12. The computer program product of claim 11, further comprising:
    sixth instructions for iteratively changing the setting of the trade-off value, associating costs with tiles in the plurality of tiles based on the iteratively changing setting of the trade-off value, and adjusting the portion of the Steiner tree topology.

13. The computer program product of claim 10, wherein the environmental component includes an area density component and a routing density component.

14. The computer program product of claim 10, wherein the timing component includes a tile delay cost component representing a cost associated with deviating from an optimum spacing between buffer insertion points.

15. The computer program product of claim 10, wherein the third instructions for associating a cost with each tile includes instructions for generating a cost value for each tile based on the following equation:

$$\mathrm{cost}(t)=1+K*e(t)+(1-K)*TDC(B(t))$$

where t is the tile, cost(t) is the cost associated with the tile, K is a trade-off value, e(t) is an environmental cost associated with the tile t, and TDC(B(t)) is a tile delay cost associated with the tile.

16. The computer program product of claim 10, further comprising:
fifth instructions for inserting buffers into the adjusted Steiner tree topology.

17. The computer program product of claim 11, wherein the fourth instructions for adjusting a portion of the topology of the initial timing-driven Steiner tree based on the cost associated with each tile in the plurality of tiles, further include:
instructions for determining if any nets in the portion of the topology of the initial timing-driven Steiner tree have negative slack or require electrical correction after adjusting the portion of the topology of the initial timing-driven Steiner tree;
instructions for modifying the trade-off value in response to a determination that at least one net in the portion of the topology of the initial timing-driven Steiner tree has negative slack or requires electrical correction after having been adjusted; and
instructions for readjusting the at least one net based on the modified trade-off value and the cost associated with each tile in the plurality of tiles.

18. An apparatus for optimizing routing and buffer insertion in an integrated circuit design, comprising:
means for generating an initial timing-driven Steiner tree connecting a source node to at least one sink node in an integrated circuit design, wherein the initial timing-driven Steiner tree is generated without accounting for densities of regions in the integrated circuit design;
means for dividing the initial timing-driven Steiner tree into a plurality of tiles;
means for associating a cost with each tile of the plurality of tiles, wherein the cost includes a timing component and an environmental component; and
means for adjusting a portion of the topology of the initial timing-driven Steiner tree based on the cost associated with each tile in the plurality of tiles, thereby generating an adjusted Steiner tree topology.

19. The apparatus of claim 18, further comprising:
means for setting a trade-off value for determining a trade-off between the timing component and the environment component of the cost associated with each tile, wherein associating a cost with each tile includes calculating a cost for each tile based on the setting of the trade-off value.

20. The apparatus of claim 19, further comprising:
means for iteratively changing the setting of the trade-off value, associating costs with tiles in the plurality of tiles based on the iteratively changing setting of the trade-off value, and adjusting the portion of the Steiner tree topology.

21. The apparatus of claim 18, wherein the environmental component includes an area density component and a routing density component.

22. The apparatus of claim 18, wherein the timing component includes a tile delay cost component representing a cost associated with deviating from an optimum spacing between buffer insertion points.

23. The apparatus of claim 18, wherein the means for associating a cost with each tile includes instructions for generating a cost value for each tile based on the following equation:

$$\mathrm{cost}(t)=1+K*e(t)+(1-K)*TDC(B(t))$$

where t is the tile, cost(t) is the cost associated with the tile, K is a trade-off value, e(t) is an environmental cost associated with the tile t, and TDC(B(t)) is a tile delay cost associated with the tile.

24. The apparatus of claim 18, further comprising:
means for inserting buffers into the adjusted Steiner tree topology.

25. The apparatus of claim 19, wherein the means for adjusting a portion of the topology of the initial timing-driven Steiner tree based on the cost associated with each tile in the plurality of tiles, further includes:
means for determining if any nets in the portion of the topology of the initial timing-driven Steiner tree have negative slack or require electrical correction after adjusting the portion of the topology of the initial timing-driven Steiner tree;
means for modifying the trade-off value in response to a determination that at least one net in the portion of the topology of the initial timing-driven Steiner tree has negative slack or requires electrical correction after having been adjusted; and
means for readjusting the at least one net based on the modified trade-off value and the cost associated with each tile in the plurality of tiles.

* * * * *